(12) United States Patent
Jo et al.

(10) Patent No.: US 8,093,947 B2
(45) Date of Patent: Jan. 10, 2012

(54) POWER AMPLIFIER

(75) Inventors: Byeong Hak Jo, Gyunggi-do (KR); Yoo Sam Na, Seoul (KR); Min Sun Kim, Gyunggi-do (KR); Yoo Hwan Kim, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/823,772

(22) Filed: Jun. 25, 2010

(65) Prior Publication Data

US 2011/0133834 A1 Jun. 9, 2011

(30) Foreign Application Priority Data

Dec. 7, 2009 (KR) .................. 10-2009-0120468

(51) Int. Cl.
*H03G 3/20* (2006.01)
(52) U.S. Cl. .................. 330/136; 330/129
(58) Field of Classification Search .......... 330/136, 330/129, 285, 296
See application file for complete search history.

(56) References Cited

U.S. PATENT DOCUMENTS

| | | | |
|---|---|---|---|
| 6,445,247 B1 * | 9/2002 | Walker | 330/10 |
| 7,414,479 B2 | 8/2008 | Ripley et al. | |
| 7,420,415 B2 * | 9/2008 | Lee et al. | 330/136 |
| 7,474,149 B2 * | 1/2009 | Snelgrove et al. | 330/136 |
| 7,501,897 B2 * | 3/2009 | Mori et al. | 330/302 |
| 7,602,243 B2 * | 10/2009 | Murao | 330/136 |
| 7,859,336 B2 * | 12/2010 | Markowski et al. | 330/136 |
| 2006/0066403 A1 | 3/2006 | Grillo et al. | |

FOREIGN PATENT DOCUMENTS

| | | |
|---|---|---|
| KR | 1020050083712 A | 8/2005 |
| KR | 1020070048422 A | 5/2007 |

OTHER PUBLICATIONS

Korean Office Action for Application No. 10-2009-0120468, issued Feb. 28, 2011.

* cited by examiner

*Primary Examiner* — Henry Choe
(74) *Attorney, Agent, or Firm* — Lowe, Hauptman, Ham & Berner, LLP

(57) ABSTRACT

There is provided a power amplifier with a variable supply of bias power according to a look-up table having a voltage value determined based on a level of an RF signal being input to the power amplifier to thereby increase power efficiency. A power amplifier according to an aspect of the invention may include an amplification section amplifying an input signal according to a bias voltage being supplied; and a bias supply section comparing a level of the input signal with a look-up table set in advance and supplying a bias voltage to the amplification section according to a result of the comparison.

5 Claims, 3 Drawing Sheets

| Pin(dBm) | PD(V) | ADC | DSM_DA(uA) | DSM_PA(uA) | Bias_Bank_DA | Bias_Bank_PA |
|---|---|---|---|---|---|---|
| -40 | 0.5 | 000 | 50 | 50 | 0.41 | 0.38 |
| -35 | 0.6 | 001 | 60 | 60 | 0.42 | 0.39 |
| -30 | 0.7 | 010 | 70 | 70 | 0.43 | 0.40 |
| -25 | 0.8 | 011 | 80 | 80 | 0.44 | 0.41 |
| -20 | 0.9 | 100 | 90 | 90 | 0.45 | 0.42 |
| --- | --- | --- | --- | --- | --- | --- |
| --- | --- | --- | --- | --- | --- | --- |
| --- | --- | --- | --- | --- | --- | --- |

FIG. 2

POWER AMPLIFIER

CROSS-REFERENCE TO RELATED APPLICATIONS

This application claims the priority of Korean Patent Application No. 10-2009-0120468 filed on Dec. 7, 2009, in the Korean Intellectual Property Office, the disclosure of which is incorporated herein by reference.

BACKGROUND OF THE INVENTION

1. Field of the Invention

The present invention relates to power amplifiers, and more particularly, to a power amplifier with a variable supply of bias power according to a look-up table having a voltage value determined based on a level of an RF signal being input to the power amplifier to thereby increase power efficiency.

2. Description of the Related Art

Mobile communications terminals have been widely used because they are easy to use. As the use of these mobile communications terminals has increased, it has become important to run various kinds of applications to meet consumer demand and allow for long-time use at the same time.

In order to extend the use time of a mobile communications terminal, it is important to increase battery capacity. However, the size of batteries is limited since small, lightweight, and thin mobile communications terminals are in demand in the market. Therefore, there is a need to increase the power efficiency of main elements inside a mobile communications terminal. In order to transmit and receive RF signals, this mobile communications terminal uses a power amplifier. This power amplifier takes up a considerable portion of the overall power consumption of the mobile communication terminal. Thus, there is a need to increase the power efficiency of the power amplifier.

Meanwhile, this power amplifier is generally manufactured using a compound semiconductor. However, with the increase of manufacturing costs and advancements in a complementary metal oxide semiconductor (CMOS) process and circuit design, the number of power amplifiers being manufactured by the CMOS process has been gradually increased.

Though these power amplifiers need to satisfy linearity being demanded by consumers, since there is a trade-off between linearity and power consumption, power amplifiers are designed to satisfy linearity at the maximum power output level.

However, general power amplifiers output signals below the maximum power output level, and power consumption and linearity at the time need to be satisfied.

In the related art, the bias of an amplification unit is controlled by receiving an output signal as a feedback signal. In this case, however, it is difficult to implement a detection circuit due to a high power output level. As for the CMOS process, a CMOS device can be destroyed due to a low break down voltage. If bias control is continuously made, envelope information may be damaged.

Furthermore, the use of parallel amplification units operating at different signal levels causes an increase in circuit size and hinders input and output matching.

SUMMARY OF THE INVENTION

An aspect of the present invention provides a power amplifier with a variable supply of bias power according to a look-up table having a voltage value determined based on a level.

According to an aspect of the present invention, there is provided a power amplifier including: an amplification section amplifying an input signal according to a bias voltage being supplied; and a bias supply section comparing a level of the input signal with a look-up table set in advance and supplying a bias voltage to the amplification section according to a result of the comparison.

The bias supply section may include: a detector detecting an amplitude of the input signal; an analog-to-digital converter converting a detection value from the detector into a digital value; a current generator generating a current corresponding to the digital value from the analog-to-digital converter with reference to the look-up tale; and a current-to-voltage converter converting the current, generated from the current generator, into voltage.

The power amplifier may further include a power amplifier varying a dynamic range of the input signal according to a control signal from outside.

The amplification section may include: at least one amplification unit being supplied with the bias voltage and amplifying the input signal; an input impedance matching unit matching an impedance of a path through which the input signal is transmitted to the at least one amplification unit; and an output impedance matching unit matching an impedance of a path through which a signal is output from the at least one amplification unit.

The amplification section may include a plurality of amplification units connected in series with each other.

The amplification section may further include an intermediate impedance matching unit matching an impedance of a transmission path of a signal between the plurality of amplification units.

BRIEF DESCRIPTION OF THE DRAWINGS

The above and other aspects, features and other advantages of the present invention will be more clearly understood from the following detailed description taken in conjunction with the accompanying drawings, in which:

FIG. 2 is a view illustrating a look-up table that is used in a power amplifier according to an exemplary embodiment of the present invention.

DETAILED DESCRIPTION OF THE PREFERRED EMBODIMENT

Exemplary embodiments of the present invention will now be described in detail with reference to the accompanying drawings.

Figure 1:
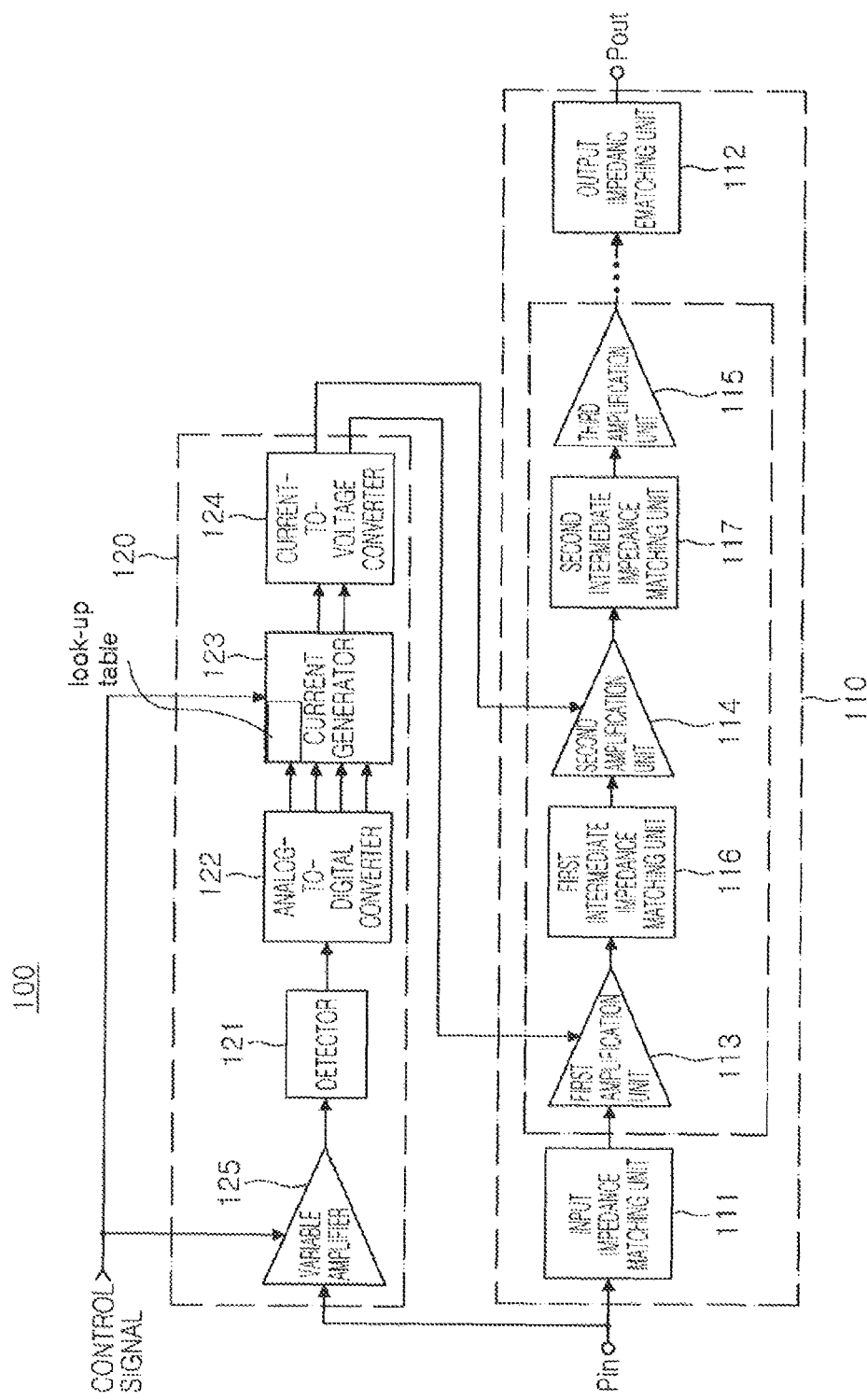
FIG. 1 is a schematic view illustrating the configuration of a power amplifier according to an exemplary embodiment of the present invention.

FIG. 1 is a schematic view illustrating the configuration of a power amplifier according to an exemplary embodiment of the invention.

Referring to FIG. 1, a power amplifier 100 according to this embodiment may include an amplification section 110 and a bias supply section 120.

The amplification section 110 may include one or more amplification units 113, 114, and 115, an input impedance matching unit 111, and an output impedance matching unit 112.

The one or more amplification units 113, 114, and 115 may include a plurality of amplification units 113, 114, and 115 that are connected in series with each other according to the purpose thereof.

The plurality of amplification units 113, 114, and 115 may receive a bias voltage from the bias supply section 120.

The input impedance matching unit 111 may match the impedance of a path through which an input signal Pin is transmitted to the first amplification unit 113. The input signal Pin may include amplitude and phase components, which may contain information.

The output impedance matching unit 112 may match the impedance of a path through which a signal being output from an amplification unit at the final stage is transmitted.

The plurality of amplification units 113, 114, and 115 may re-amplify an amplified signal, whereby a transmission path of a signal is formed, and intermediate impedance matching units 116 and 117 may be provided.

That is, the first intermediate impedance matching unit 116 may be provided for impedance matching between the first amplification unit 113 and the second amplification unit 114, while the second intermediate impedance matching unit 117 may be provided for impedance matching between the second amplification unit 114 and the third amplification unit 115.

The bias supply section 120 may include a detector 121, an analog-to-digital converter 122, a current generator 123, and a current-to-voltage converter 124.

The detector 121 may detect the signal power of the input signal Pin.

The analog-to-digital converter 122 may convert an analog value, detected by the detector 121, into a digital value.

The current generator 123 may generate a current corresponding to the digital value from the analog-to-digital converter 122 with reference to a look-up table.

The current-to-voltage converter 124 may convert the current, generated by the current generator 123, into voltage and supply the voltage to each of the amplification units of the amplification section 110.

FIG. 2 is a view illustrating a look up table for a power amplifier according to an exemplary embodiment of the invention.

As shown in FIG. 2, the detector 121 detects the signal powers of the input signal Pin at intervals of −5 dBm, for example, −40 dBm, −35 dBm, −30 dBm, −25 dBm, and −20 dBm. The signal power of the input signal Pin may increase or decrease according to the distance between an antenna and a base station.

The detector 121 may have detection values at intervals of 0.1V, for example, 0.5V, 0.6V, 0.7V, 0.8V, and 0.9V.

The analog-to-digital converter 122 converts the detection values, detected by the detector 121, into digital values. The analog-to-digital converter 122 may convert digital values corresponding to 0.5V, 0.6V, 0.7V, 0.8V, and 0.9V into 000, 001, 010, 011, and 100, respectively.

The current generator 123 generates currents according to the corresponding digital values in the look-up table. The current generator 123 may generate current values and supply the generated current values respectively to the plurality of amplification units. For example, the first and second amplification units 113 and 114 may have currents of 50 uA, 60 uA, 70 uA, 80 uA, and 90 uA according to the digital values.

The current-to-voltage converter 124 may convert the currents from the current generator 123 into voltages and supply the generated voltages respectively to the plurality of amplification units. Here, the current-to-voltage converter 124 may supply voltages having different levels to the plurality of amplification units according to the electrical characteristics of the plurality of amplification units. For example, the current-to-voltage converter 124 may supply a bias voltage of 0.41V, 0.42V, 0.43V, 0.44V, or 0.45V to the first amplification unit 113 by converting current into voltage, while the current-to-voltage converter 124 may supply a bias voltage of 0.38V, 0.39V, 0.40V, 0.41V, or 0.42V to the second amplification unit 114 by converting current into voltage.

As described above, the input signal Pin can be varied. As for wideband code division multiple access (WCDMA), since the input signal Pin has a dynamic range wide enough so that the dynamic range sweeps from −40 dBm to 0 dBm, the operation of the detector may be limited.

Thus, the bias supply section 120 may further include a variable amplifier 125 in order control the dynamic range of the input signal Pin.

The variable amplifier 125 varies gain according to a control signal from outside to thereby amplify the input signal Pin.

The control signal may be supplied from a baseband circuit or may be a signal used to control a transmission mode at baseband.

The control signal is a digital signal of 00, 01, 10, or 11. A digital signal of 00 may be used to perform control in a disable mode, a digital signal of 01 may be used to perform control in a lower power mode, a digital signal of 10 may be used to perform control in an intermediate power mode, and a digital signal of 11 may be used to perform control in a high power mode. The variable amplifier 125 may be disabled when the control signal is a digital signal of 00, may operate in a +15 dB gain mode when the control signal is a digital signal of 01, may operate in a 0 dB gain mode when the control signal is a digital signal of 10, and may operate in a −15 dB gain mode when the control signal is a digital signal of 11.

Therefore, a signal having a dynamic range from −30 dBm to 15 dBm may be input to the detector, and the current generator 123 also operates in interlock with the control signal, it is possible to handle the entire signal range from −40 dBm to 0 dBm of the input signal Pin.

Figure 3:
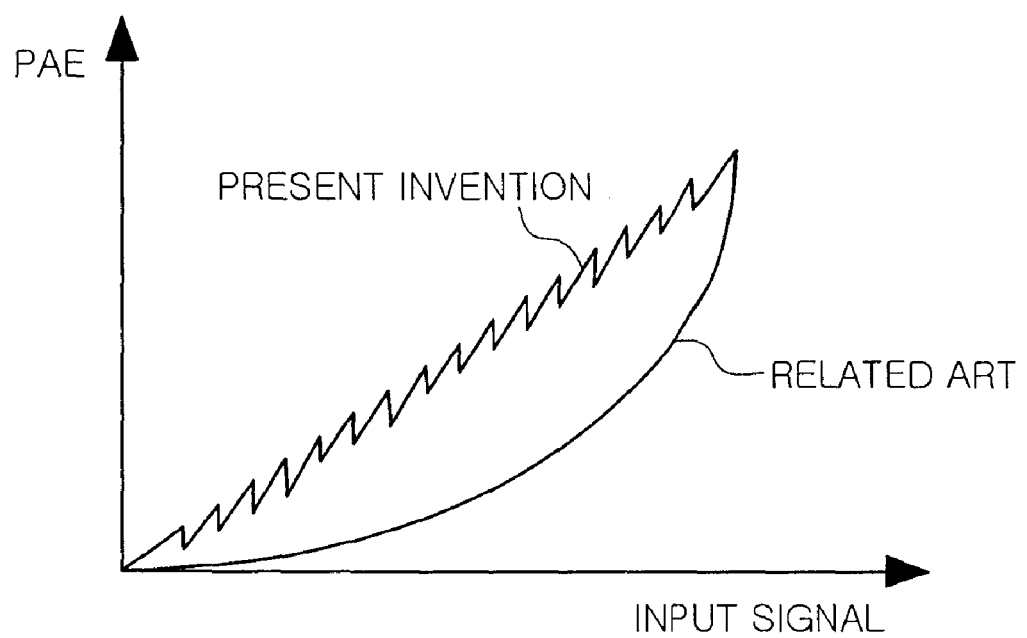
FIG. 3 is a graph illustrating the electrical characteristics of a power amplifier according to an exemplary embodiment of the present invention.

FIG. 3 is a graph illustrating the electrical characteristic of a power amplifier according to an exemplary embodiment of the invention.

As illustrated in the graph of FIG. 3, unlike the related art, a power amplifier according to an exemplary embodiment of the invention realizes a variable supply of a bias voltage in a non-continuous manner so that power consumption is reduced according to the power levels of the input signal, while PAE is increased. Furthermore, when the distance between base stations is increased, the power of the input signal is increased, and a bias voltage is thus increased to thereby ensure linearity.

As described above, according to exemplary embodiments of the invention, since a bias voltage is supplied by detecting an input signal, a power amplifier can be manufactured by a standard CMOS process with a low break down voltage, thereby reducing manufacturing costs and size. Since a bias voltage varying according to a look-up table does not change in a continuous manner, additional envelope distortions are not introduced.

As set forth above, according to exemplary embodiments of the invention, a variable supply of a bias voltage is realized according to a look-up table having a voltage value determined based on a level of an RF signal being input to a power amplifier, thereby increasing power efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A power amplifier comprising:
    an amplification section configured to amplify an input signal according to a bias voltage being supplied; and
    a bias supply section configured to supply the bias voltage to the amplification section according to a result of the comparison,
    wherein the bias supply section comprises:
    a detector configured to detect an amplitude of the input signal;
    an analog-to-digital converter configured to convert a detection value from the detector into a digital value;
    a current generator configured to generate a current signal corresponding to the digital value from the analog-to-digital converter with reference to a look-up table having a current value corresponding to the digital value; and
    a current-to-voltage converter configured to convert the current signal, generated from the current generator, into the bias voltage.

2. The power amplifier of claim 1, further comprising a power amplifier varying a dynamic range of the input signal according to a control signal from outside.

3. The power amplifier of claim 1, wherein the amplification section comprises:
    at least one amplification unit being supplied with the bias voltage and configured to amplify the input signal;
    an input impedance matching unit configured to match an impedance of a path through which the input signal is transmitted to the at least one amplification unit; and
    an output impedance matching unit configured to match an impedance of a path through which a signal is output from the at least one amplification unit.

4. The power amplifier of claim 3, wherein the amplification section comprises a plurality of amplification units connected in series with each other.

5. The power amplifier of claim 4, wherein the amplification section further comprises an intermediate impedance matching unit matching an impedance of a transmission path of a signal between the plurality of amplification units.

* * * * *